(12) United States Patent
Havemann et al.

(10) Patent No.: US 6,358,849 B1
(45) Date of Patent: Mar. 19, 2002

(54) INTEGRATED CIRCUIT INTERCONNECT AND METHOD

(75) Inventors: Robert H. Havemann, Garland, TX (US); Girish A. Dixit, San Jose, CA (US); Manoj Jain, Plano, TX (US); Eden Zielinski, Boise, ID (US); Qi-Zhong Hong, Dallas; Jeffrey West, San Antonio, both of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/467,680

(22) Filed: Dec. 21, 1999

Related U.S. Application Data
(60) Provisional application No. 60/114,039, filed on Dec. 29, 1998, and provisional application No. 60/068,661, filed on Dec. 23, 1997.

(51) Int. Cl.[7] ............................................. H01L 21/302
(52) U.S. Cl. ...................... 438/689; 438/700; 438/723; 438/724
(58) Field of Search ................................. 438/700, 720, 438/723, 724, 689

(56) References Cited

U.S. PATENT DOCUMENTS

| | | | | |
|---|---|---|---|---|
| 4,888,087 A | * | 12/1989 | Moslehi et al. | 438/620 |
| 5,488,013 A | * | 1/1996 | Geffken et al. | 438/643 |
| 5,635,423 A | * | 6/1997 | Huang et al. | 438/643 |

* cited by examiner

*Primary Examiner*—Benjamin L. Utech
*Assistant Examiner*—Lynette T. Umez-Eronini
(74) *Attorney, Agent, or Firm*—Carlton H. Hoel; W. James Brady; Frederick J. Telecky, Jr.

(57) ABSTRACT

A dual inlaid interconnect fabrication method using a temporary filler in a via during trench etch and removal of the filler after trench etch. This provides via bottom protection during trench etch.

5 Claims, 8 Drawing Sheets

INTEGRATED CIRCUIT INTERCONNECT AND METHOD

RELATED APPLICATIONS

This application claims priority under 35 USC §119(e)(1) of provisional application No. 60/114,039 filed Dec. 29, 1998. The following patent applications disclose related subject matter: Serial No. 60/068,661, filed Dec. 23, 1997 (T26419). This application has a common assignee with the present application.

BACKGROUND OF THE INVENTION

The invention relates to electronic semiconductor devices, and, more particularly, to dielectric structures and fabrication methods for such structures.

The performance of high density integrated circuits is dominated by metal interconnect level RC time delays due to the resistivity of the metal lines and the capacitive coupling between adjacent lines. The capacitive coupling can be reduced by decreasing the relative permittivity (dielectric constant, k) of the dielectric (electrical insulator) between adjacent lines.

Various dielectric materials have been suggested for use in silicon integrated circuits to replace the commonly used silicon dioxide (k about 4.0). The leading candidates are fluorinated silicon dioxide (k about 3.0–4.0), organic polymers such as polyimide, parylene, bis-benzocyclobutene (BCB), amorphous teflon (k about 1.9–3.9), and porous dielectrics such as silicon dioxide based xerogels (k dependent upon pore size and typically 1.3–3.0).

Similarly, decreasing the resistivity of the interconnect metal by substituting copper (or silver) for the commonly used aluminum and tungsten will also reduce the RC time constant.

Copper interconnects typically require a dual inlaid (dual damascene) process for fabrication which uses a first via etch through two dielectric layers followed by a second interconnect trench etch through just the top dielectric. Then the trench and via are filled with copper by blanket deposition plus planarization to remove copper outside of the trench and via; chemical mechanical polishing (CMP) provides the planarization. However, photoresist exposure and development for the trench etch has problems at the vias, and subsequent trench etch can breakthrough the interconnect passivation at the via bottoms.

Thus the current fabrication methods for copper interconnects using CMP processing have manufacturability problems.

SUMMARY OF THE INVENTION

The present invention provides a temporary filler for etched vias during dual inlaid interconnect trench processing.

This has the advantages of robust dual inlaid processing.

BRIEF DESCRIPTION OF THE DRAWINGS

The drawings are heuristic for clarity.

DESCRIPTION OF THE PREFERRED EMBODIMENTS

Overview

The preferred embodiments provide a dual inlaid (dual damascene) type processing with a temporary filler in the vias to simplify trench formation. This limits trench photolithography anomalies at the vias and protects the via bottoms during a trench etch. With silicon dioxide (or silicon dioxide based) dielectric, a parylene temporary via filler could be used; thus the filler could be selectively removed (e.g., oxygen plasma) after trench formation.

First Preferred Embodiment

FIGS. 1a–1l illustrate in cross sectional elevation views the steps of first preferred embodiment fabrication methods for integrated circuits (e.g., CMOS or BiCMOS) which use metal plugs in the premetal dielectric (PMD) with single inlaid (damascene) first level metal plus dual inlaid second and higher level metal interconnects as follows.

Figure 1A:
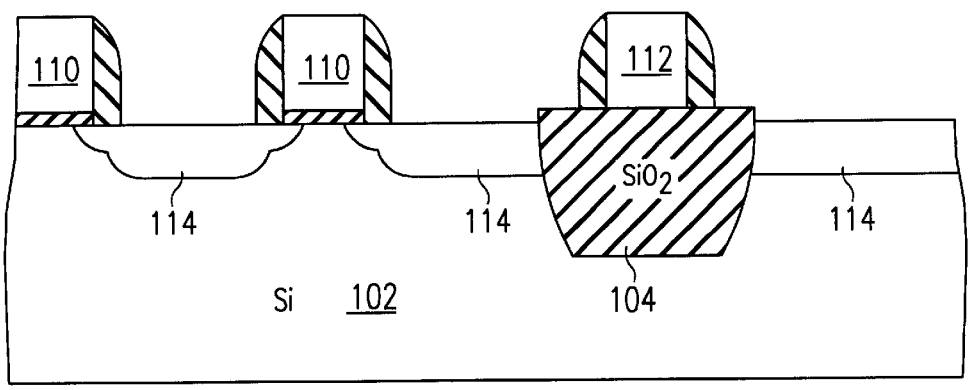
FIGS. 1a–1l are cross sectional elevation views of a preferred embodiment integrated circuit fabrication method steps.

(1) Start with a silicon wafer (or silicon on insulator wafer) with shallow trench isolation and twin wells for CMOS devices (optionally, plus memory cell array wells and bipolar device buried layers). Perform threshold adjustment implants (which may differ for cell transistors and various peripheral transistors), and form gate dielectric. Deposit tungsten silicide coated polysilicon gate material and a silicon dioxide layer, then pattern the layers to form oxide-topped gates plus gate level interconnects. The gate material could also provide a polysilicon emitter for bipolar devices which would also require a prior base implant. See FIG. 1a which shows silicon substrate 102 with shallow trench isolation oxide 104 plus gates 110 and gate level interconnect 112. Gates 110 may be 200–300 nm high and 100–200 nm long (FIG. 1a is a cross section along the gate length, and gates typically have widths much greater than their lengths). An alternative would be formation of polysilicon gates followed by a self-aligned silicidation (after the source/drain and sidewall spacer formation of the next step) to create a suicide on both the gate top and the source/drains.

Figure 1B:
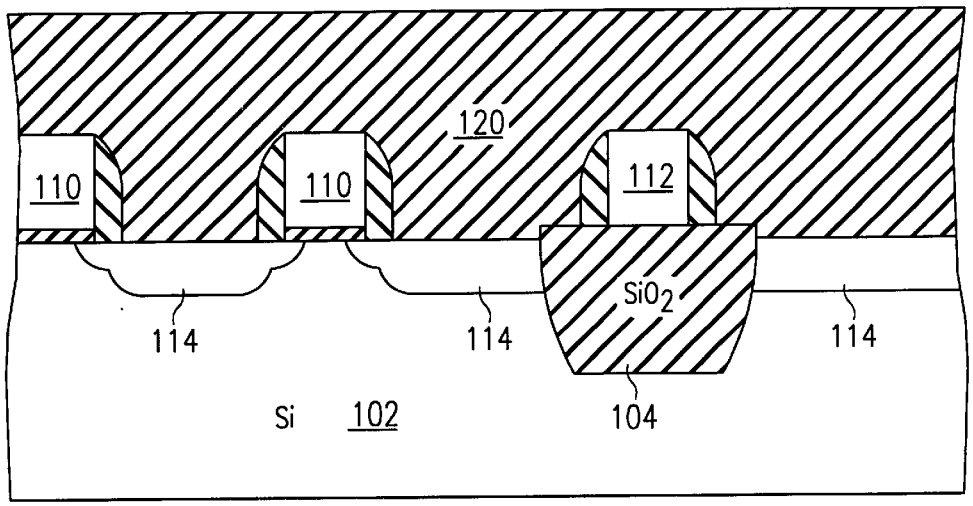
Figure 1C:
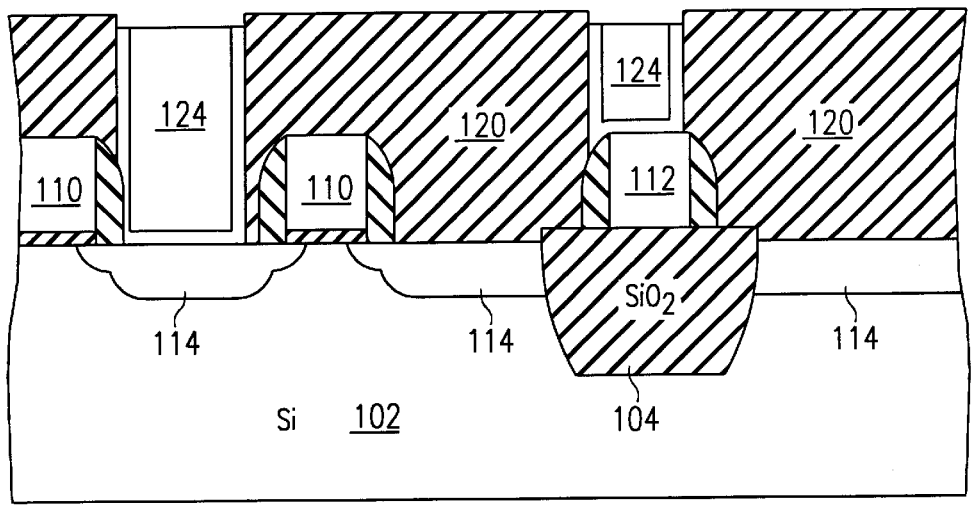
Figure 1D:
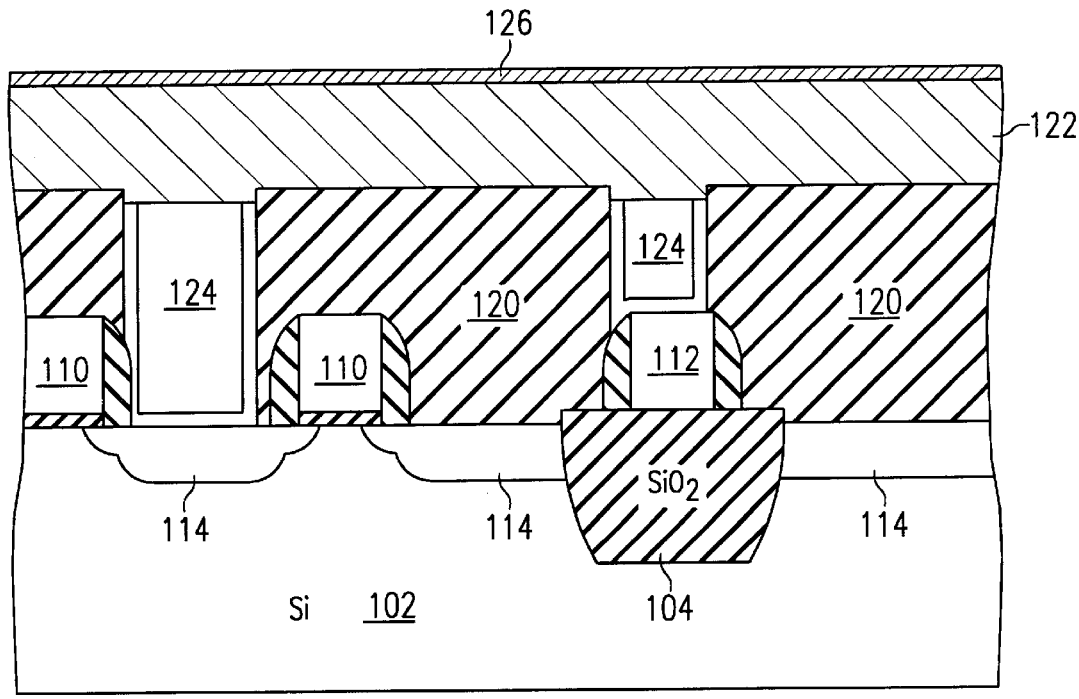
Figure 1E:
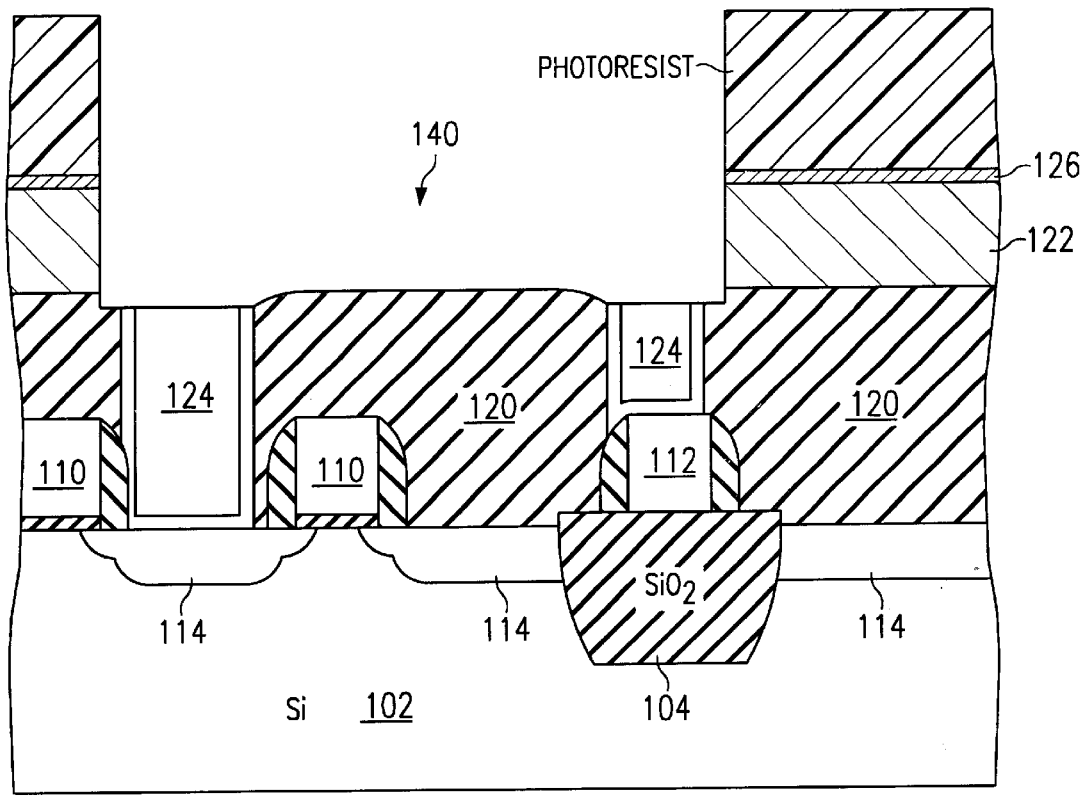
Figure 1F:
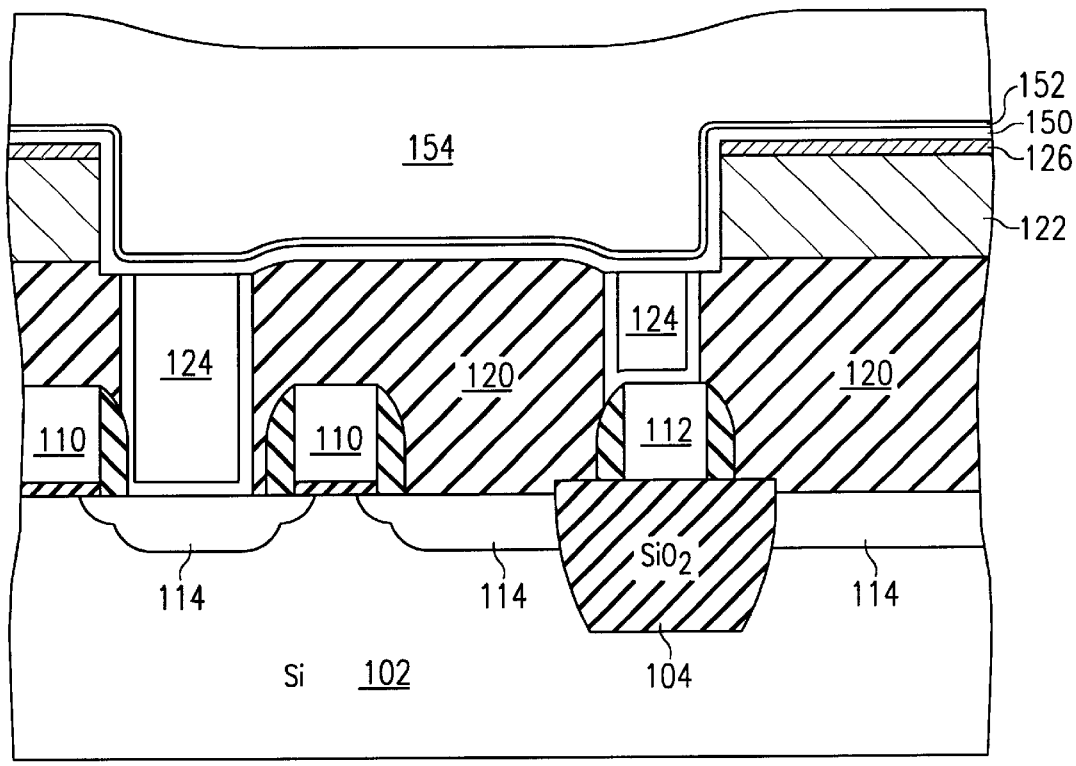
Figure 1G:
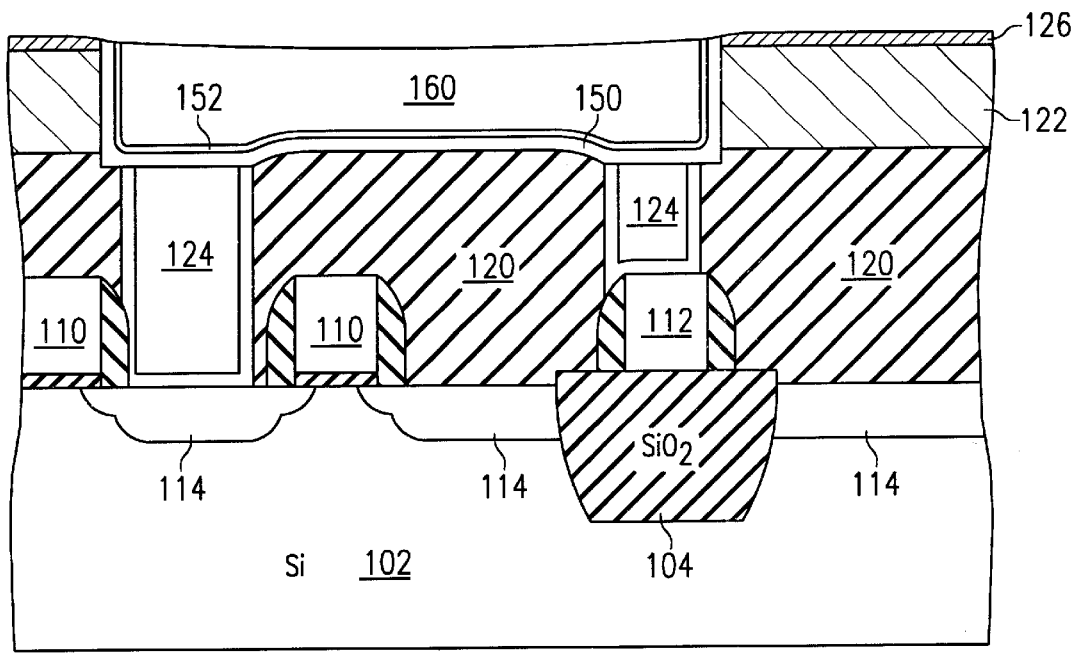

(2) Perform lightly doped drain implants, and then form sidewall spacer on the gates by deposition plus anisotropic etching of a dielectric such as oxide or nitride. Optionally, selectively grow silicon to raise the source/drains. Introduce dopants to form sources and drains 114. Cover the gate level structure with a planarized dielectric layer 120 (such as BPSG or a stack of conformal and planarized layers with the top layer a doped oxide); see FIG. 1b showing dielectric layer 120 having a thickness of roughly 800 nm. The doped oxide as a getter for impurities diffusing from higher levels towards the transistors.

(3) For a structure with an embedded memory cell array using one-transistor one-capacitor memory cells, the bitlines and cell capacitors may be formed next. For clarity such steps are not illustrated and attendant additional dielectrics deposited on dielectric 120 will just be considered part of dielectric 120.

(4) Spin on photoresist and expose it to define locations for holes (contacts, vias) in planarized dielectric 120 which will extend down to selected source/drains 114 and areas on gate level interconnects 112 (and also to selected bitline areas for embedded memory). These vias will have minimal dimensions; e.g., diameters of 100–200 nm. Etch the vias with a high density, low pressure plasma of CF4+CHF3+O2, and then strip the photoresist.

(5) Blanket deposit (including filling vias) a metal stack such as 20 nm of Ti, 20 nm of TiN, 200 nm of W or Al (doped with Cu and Si); the bottom Ti and TiN form a diffusion barrier. Prior to the W or Al deposition the bottom Ti may be reacted with the source/drain to form a suicide to stabilize the metal-to-silicon contact. The Ti and TiN may be deposited by physical vapor deposition (PVD) or chemical vapor deposition (CVD) (e.g., TDMAT+NH3→TiN+N2+ CH4); the aluminum may be deposited by PVD and then forced into the vias under high pressure or by CVD; and W may be deposited by CVD using WF6 and H2. Etchback or chemically mechanically polish (CMP) to remove all of the metal except metal plugs 124 in the vias. The oxide-based dielectric 120 has sufficient strength and diffusion barrier properties to withstand the CMP and subsequent cleaning. See FIG. 1c.

(6) Deposit dielectric 122. This could be fluorinated silicon dioxide deposited with plasma enhancement from precursors such as TEOS plus CF4.

(7) Deposit silicon oxynitride ARC layer 126. See FIG. 1d.

(8) Spin on photoresist 132 and expose it to define locations for trenches 140 in dielectric 122 which will be filled with metal to form the interconnects. The minimal spacing between adjacent trenches will be about 150–300 nm, so free-standing dielectric strips will have an aspect ratio of at most roughly 2 to 1. Etch the ARC and dielectric 122. The etch may be a single step anisotropic fluorine-based plasma etch, such as CF4+CHF3+O2+Ar which etches both ARC and dielectric or a two-step etch. Dielectric 120 could have a nitride upper portion to provide a more selective etchstop for the trench etch. See FIG. 1e.

Strip the photoresist with an oxygen plasma.

(9) Blanket deposit 10–20 nm thick TiN conformal barrier layer 150 by PVD or CVD. Other barrier materials include TaN, Ta2N, W2N and TiSiN (which can be formed by silane treatment of amorphous TiN). CVD TiN provides better sidewall coverage than PVD, so use a CVD process such as ammonia plus tetrakisdimethylamino titanium (TDMAT). Next, deposit (e.g., CVD, PVD) 10 nm thick copper seed layer 152 on TiN 150, and then electroplate copper 154 to fill the interconnect trenches etched in dielectric 122 plus cover the remainder of the wafer. See FIG. 1f.

(10) Remove the portion of copper and TiN barrier outside of the interconnect trenches by CMP; the CMP also planarizes any bumpiness in the plated copper. Initially use a hard pad to planarize, and then follow with a soft pad. ARC 126 acts as a CMP polish stop; copper polishes faster than the silicon oxynitride. The remaining copper forms interconnects 160; see FIG. 1g.

(11) Passivate the exposed top surface of copper interconnects 160 by either a blanket deposition of 10–20 nm of silicon nitride or a more involved passivation such as: blanket deposition of Ti (e.g., by sputtering) followed by a reaction to form $Cu_3Ti$, a wet strip of the unreacted Ti, and a plasma nitridation in ammonia to convert to TiN. This completes the first level metal.

For the second and higher metal level interconnects, roughly repeat the foregoing steps but with dual inlaid (dual damascene) processing as follows.

(12) Form 500 nm thick dielectric layer 170 as previously described; next, deposit a 10–20 nm thick layer of silicon nitride 171; and then form 300 nm thick dielectric layer 172. Dielectrics 170 and 172 are both fluorinated silicon dioxide in this preferred embodiment, but they may be different materials in other embodiments. The silicon nitride will be an etch stop for the subsequent interconnect trench etch.

Figure 1H:
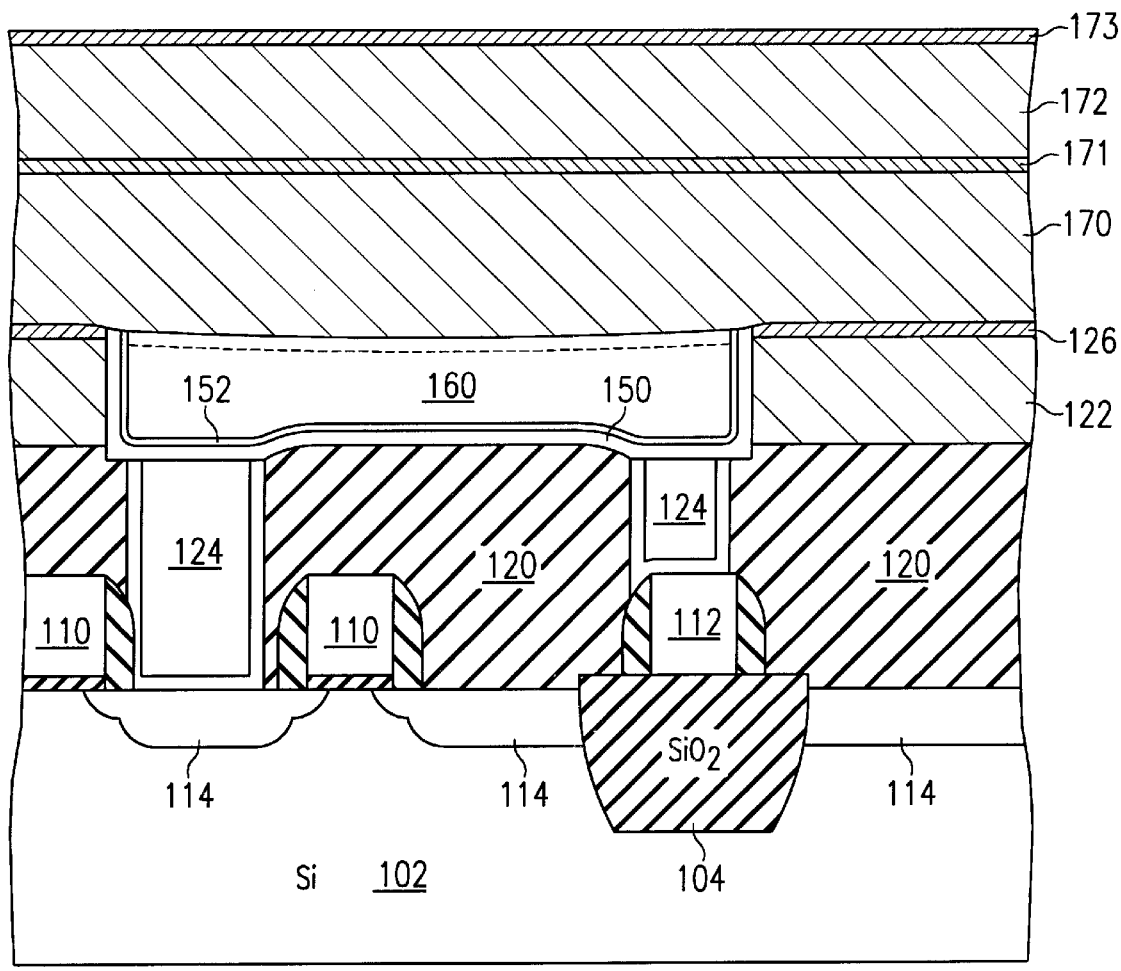
Figure 1I:
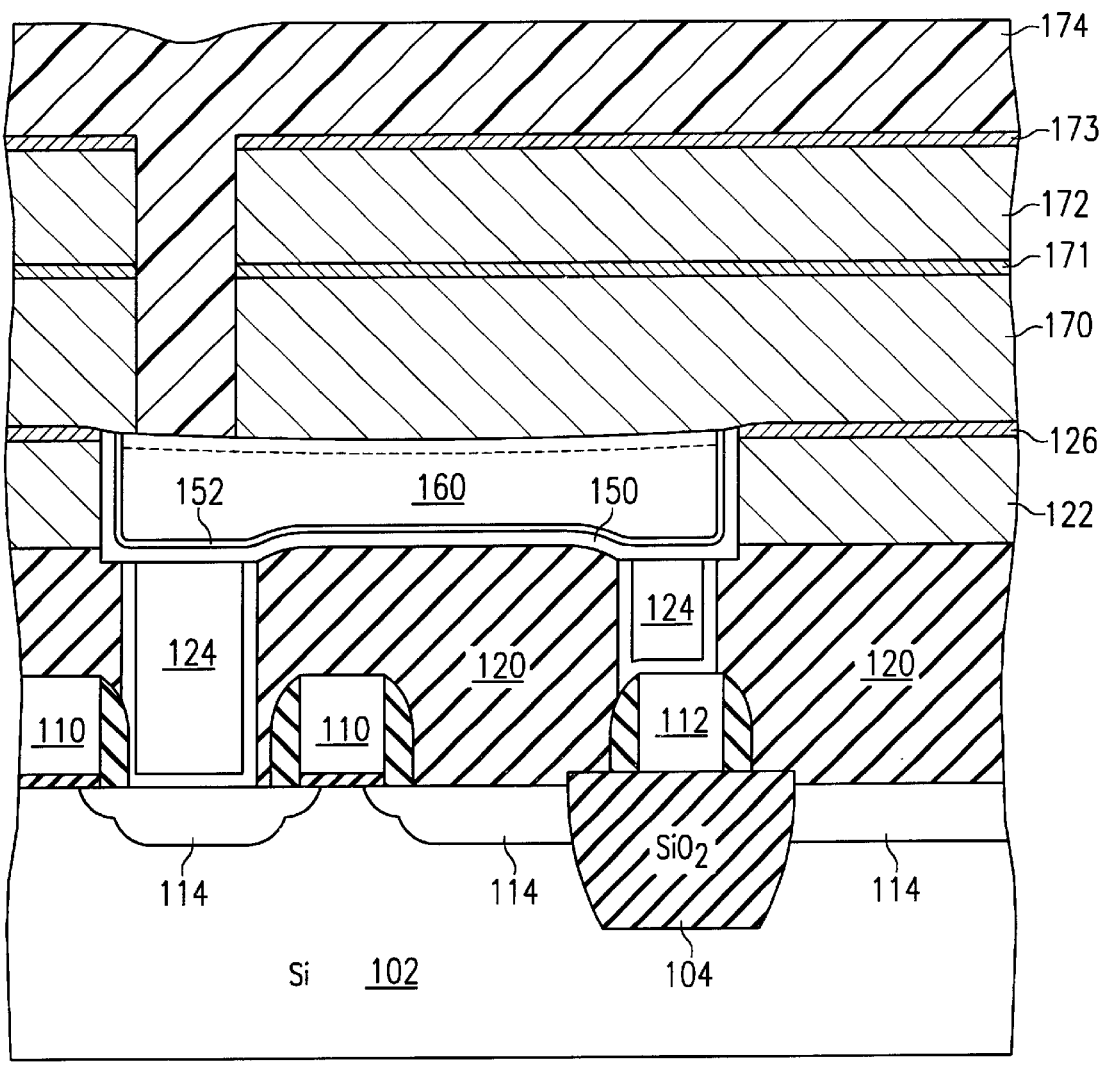
Figure 1J:
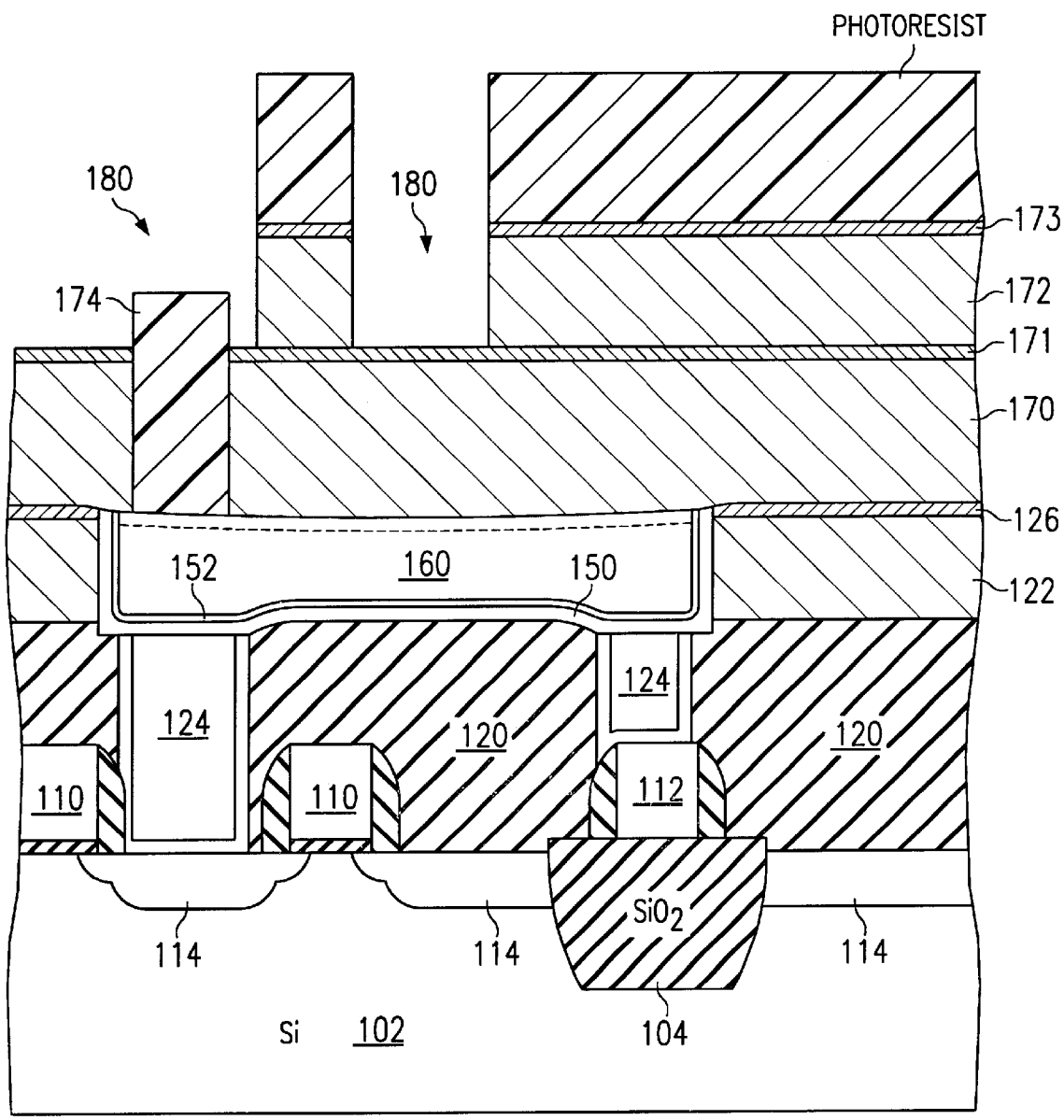

Next, deposit 10 nm thick silicon oxynitride ARC layer 173 by PECVD with silane plus N2O; see FIG. 1h.

(13) Spin on photoresist and expose and develop it to define locations for vias. Next, etch the vias through ARC 173, dielectric 172, nitride 171, and dielectric 170 to end on the passivation of interconnects 160. If the passivation of interconnect 160 is nonconducting (e.g., silicon nitride), also etch it away at the bottom of the via. Again, one step or multistep etching could be used. Then strip the photoresist.

(14) Blanket deposit (including filling the vias) conformal layer 174 of parylene by surface polymerization of monomers CH2C6H4CH2 from the vapor phase. Parylene 174 may be 75–150 nm thick which will fill the vias and will act as a temporary filler; see FIG. 1i.

(15) Etchback parylene 174 to remove it from ARC 173 but leaving the via filled; use an O2 plasma etch. Use endpoint detection plus some overetch, this will also remove some of the parylene from the upper portions of the vias.

(16) Spin on second photoresist and expose and develop it to define locations for second level interconnect trenches 180 in dielectric 172. The parylene filler 174 in the vias avoids exposure problems if photoresist were also in the vias. Analogous to the first level metal, the trenches and vias will be filled with metal to form the second level interconnects. With a plasma etch of CHF3+CF4+Ar, etch trenches through 300 nm thick dielectric 172 down to nitride etch stop 171. This also etches some of parylene 174 in the vias; see FIG. 1j. Note that parylene 174 filling the vias during the trench etch prevents this dielectric etch from attacking the copper as would be the case with unfilled vias.

(17) Strip the parylene and photoresist with oxygen plasmas. This reopens the vias.

Figure 1K:
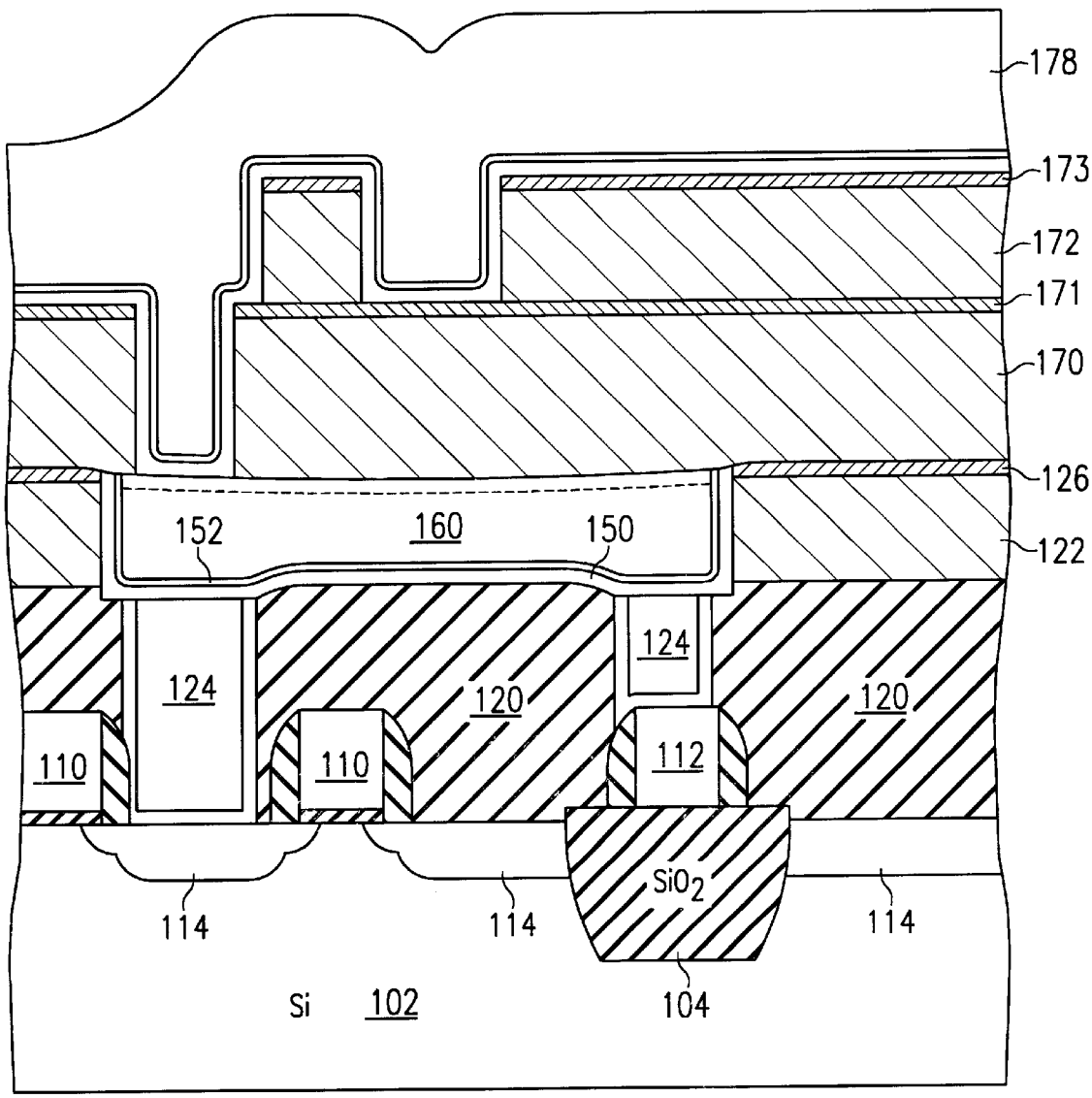
Figure 1L:
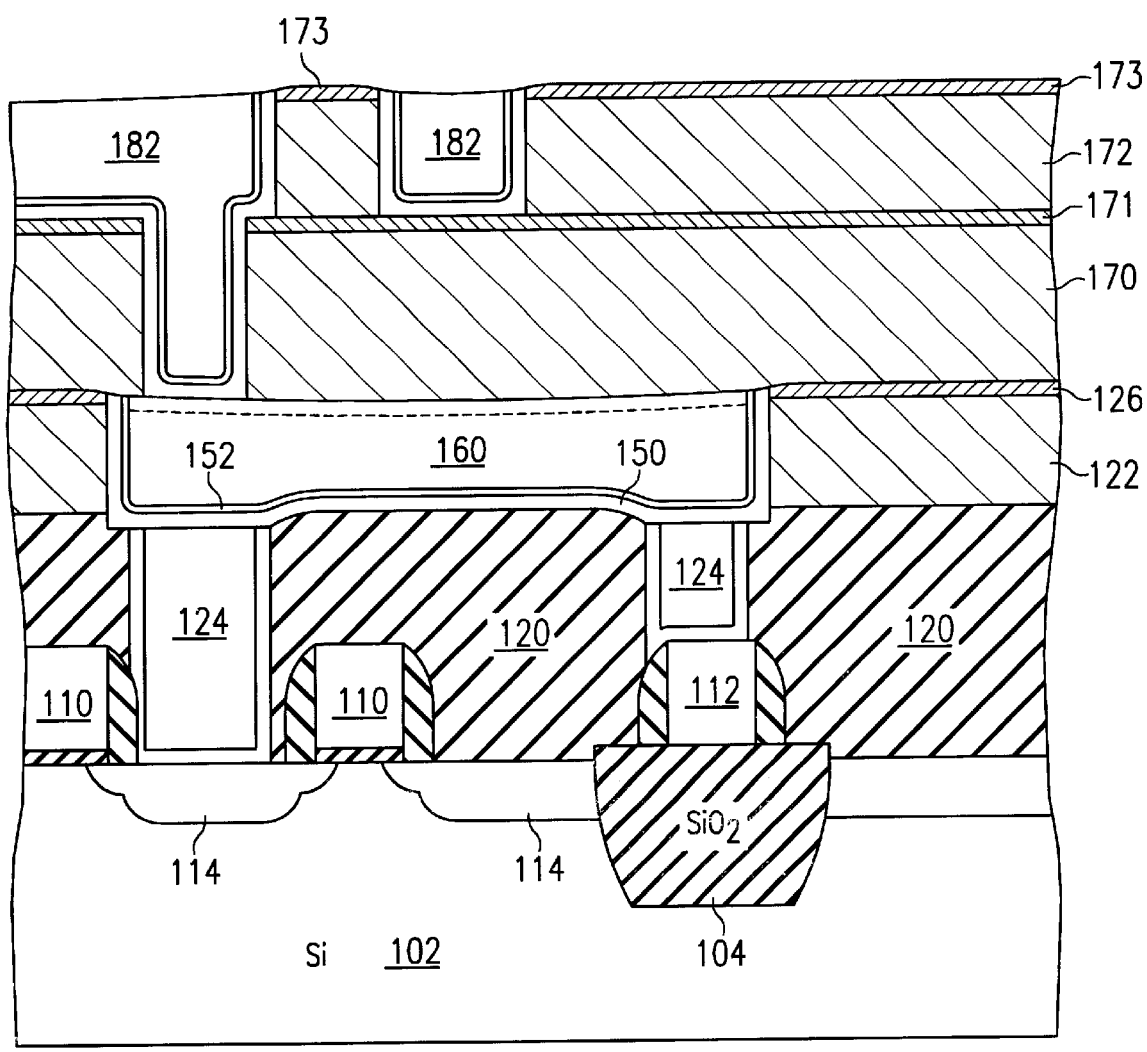

(18) Deposit 10–20 nm thick conformal TiN by CVD, deposit 10 nm thick seed layer copper by CVD, and electroplate 200 nm thick copper to fill the trenches and vias. See FIG. 1k showing copper 178.

(19) Remove the copper outside of the interconnect trenches with CMP; again, silicon oxynitride 173 acts as a polish stop. See FIG. 1a showing second level copper interconnects 182.

(20) Passivate the exposed copper (e.g., thin nitride deposition or the TiN as previously described) to complete the second level interconnects.

Repeat steps (12)–(19) for further metal levels, although the top metal level need not be planarized and could be aluminum and other metal levels could be formed in different manners.

Further Preferred Embodiments

Further preferred embodiments use other dielectrics, temporarily fill the vias with other materials, and use different removal methods. In particular, various silicon dioxide based dielectrics could be used directly in place of one or both of the fluorinated silicon oxide dielectrics 170 and 172. For example, nonfluorinated oxide, xerogels (porous silicon dioxide made by spin on, gel polymerization, and drying), spin-on glasses, and silicon-dioxide-lined dielectrics such as organic polymers and xerogels. With these dielectrics the parylene filler could also be other vapor deposited organic or spin-on organic materials that could be selectively removed from the silicon dioxide based dielectric by oxygen plasmas. Note that for silicon-dioxide-lined organic dielectrics, apply a thin silicon dioxide conformal layer after the via etch but prior to the parylene filler deposition. Also, a polysilicon filler could be selectively removed with a chlorine based plasma.

Further, various organic polymer dielectrics could be used instead of one or both of the silicon dioxide based dielectrics 170 and 172; for example, bis-benzocyclobutene-F8 (BCB), teflon-AF, polynaphthalene, polynaphthalene-F, and parylene-F. With organic polymer dielectrics, use of an oxygen plasma to remove a via filler material will likely degrade the dielectric, so a CVD metal via filler could be used and removed with wet chemistry. For example, TaN could be removed with HF, and TiN could be removed with a solution such as SC1 or SC2 (NH4OH+H2O2 and HCl+H2O2).

Alternatively, with these organic polymer dielectrics, the filler could be another polymer which is removed by thermal decomposition at temperatures on the order of 200–300 C. in a nitrogen atmosphere. The dielectrics BCB, polynaphthalene, and polynaphthalene-F are stable to about 600 C. or higher and parylene-F to about 530 C.; however, this approach is more delicate for teflon-AF which is only stable to about 400 C. A thermally decomposing polymer could be a copolymer of 10% parylene and 90% tetrachloro-o-benzoquinone or o-benzoquinone; the parylene diradical monomers initiate the copolymerization on the growth surface.

Modifications

The preferred embodiments can be modified in various ways while retaining the feature of a temporary via filler. For example, the dimensions and thicknesses can be varied, the etchstop and barrier layers could be varied, and materials other than copper could be used as the interconnect metal.

What is claimed is:

1. A method of fabricating an inlaid interconnect structure, comprising the steps of:
   (a) forming a via through a dielectric layer;
   (b) filling said via with a removable material;
   (c) after step (b) forming a trench in said dielectric layer;
   (d) removing said removable material; and
   (e) filling said via and said trench with interconnect material.

2. The method of claim 1, wherein:
   (a) said removable material is parylene.

3. The method of claim 1, wherein:
   (a) said dielectric layer includes three sublayers: a bottom sublayer, a middle sublayer, and a top sublayer; and
   (b) said step (c) of claim 1 includes etching said top sublayer and stopping said etching on said middle sublayer.

4. The method of claim 1, further comprising the step of:
   (a) after step (e) of claim 1, removing any of said interconnect material outside of said via and trench.

5. The method of claim 4, wherein:
   (a) said removing is by chemical mechanical polishing.

* * * * *